(12) United States Patent
Watanabe et al.

(10) Patent No.: US 9,894,743 B2
(45) Date of Patent: *Feb. 13, 2018

(54) EXTREME ULTRAVIOLET LIGHT GENERATION APPARATUS

(71) Applicant: GIGAPHOTON INC., Oyama-shi, Tochigi (JP)

(72) Inventors: Yukio Watanabe, Hiratsuka (JP); Miwa Igarashi, Oyama (JP); Masato Moriya, Oyama (JP); Hiroaki Nakarai, Hiratsuka (JP)

(73) Assignee: GIGAPHOTON INC., Tochigi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/984,458

(22) Filed: Dec. 30, 2015

(65) Prior Publication Data

US 2016/0192469 A1 Jun. 30, 2016

Related U.S. Application Data

(63) Continuation of application No. 13/809,582, filed as application No. PCT/JP2012/058495 on Mar. 23, 2012, now Pat. No. 9,301,379.

(30) Foreign Application Priority Data

| Mar. 30, 2011 | (JP) | 2011-076519 |
| Sep. 5, 2011 | (JP) | 2011-192971 |
| Jan. 6, 2012 | (JP) | 2012-001052 |

(51) Int. Cl.
*H05G 2/00* (2006.01)
*G03F 7/20* (2006.01)

(52) U.S. Cl.
CPC ......... *H05G 2/008* (2013.01); *G03F 7/70033* (2013.01); *H05G 2/003* (2013.01)

(58) Field of Classification Search
CPC .............................. H05G 2/003; H05G 2/008
See application file for complete search history.

(56) References Cited

U.S. PATENT DOCUMENTS 4,644,576 A * 2/1987 Kuyel ................. G03F 7/70016
250/492.2
8,698,111 B2 4/2014 Nishisaka et al.
(Continued)

FOREIGN PATENT DOCUMENTS

| JP | 2007-088267 A | 4/2007 |
| JP | 2012-109218 A | 6/2012 |

OTHER PUBLICATIONS

An Office Action; "Notice of Reason for Rejection," issued by the Japanese Patent Office on Jan. 5, 2016, which corresponds to Japanese Patent Application No. 2012-001052 and is related to U.S. Appl. No. 14/984,458; with English language translation.
(Continued)

*Primary Examiner* — Jason McCormack
*Assistant Examiner* — Sean Luck
(74) *Attorney, Agent, or Firm* — Studebaker & Brackett PC

(57) ABSTRACT

An apparatus for generating extreme ultraviolet light may include: a chamber having an opening through which a laser beam is introduced into the chamber; a reference member on which the chamber is mounted; a target supply unit for supplying a target material to be irradiated by the laser beam to a predetermined region inside the chamber; a laser beam focusing optical system for focusing the laser beam in the predetermined region inside the chamber to turn the target material into plasma; and a collector mirror for collecting the extreme ultraviolet light emitted from the plasma.

22 Claims, 12 Drawing Sheets

(56) References Cited

U.S. PATENT DOCUMENTS

| | | |
|---|---|---|
| 2005/0157279 A1 | 7/2005 | Miyachi et al. |
| 2005/0207536 A1* | 9/2005 | Shiraishi ............ G03F 7/70033 378/119 |
| 2007/0102653 A1 | 5/2007 | Bowering et al. |
| 2009/0267003 A1 | 10/2009 | Moriya et al. |
| 2010/0024980 A1 | 2/2010 | Ershov et al. |
| 2010/0051832 A1 | 3/2010 | Nishisaka et al. |
| 2010/0078577 A1 | 4/2010 | Moriya et al. |
| 2010/0078580 A1 | 4/2010 | Endo et al. |
| 2010/0117009 A1 | 5/2010 | Moriya et al. |
| 2010/0127191 A1 | 5/2010 | Partlo et al. |
| 2010/0258750 A1 | 10/2010 | Partlo et al. |
| 2012/0104290 A1 | 5/2012 | Nishisaka et al. |

OTHER PUBLICATIONS

International Search Report issued in International Application No. PCT/JP2012/058495 dated Jun. 22, 2012.

* cited by examiner

EXTREME ULTRAVIOLET LIGHT GENERATION APPARATUS

CROSS-REFERENCE TO RELATED APPLICATIONS

The present application is a continuation of U.S. patent application Ser. No. 13/809,582, filed on Jan. 10, 2013, which claims priority from Japanese Patent Application No. 2011-076519 filed Mar. 30, 2011, Japanese Patent Application No. 2011-192971 filed Sep. 5, 2011, and Japanese Patent Application No. 2012-001052 filed Jan. 6, 2012.

BACKGROUND

1. Technical Field

This disclosure relates to an extreme ultraviolet (EUV) light generation apparatus.

2. Related Art

In recent years, semiconductor production processes have become capable of producing semiconductor devices with increasingly fine feature sizes, as photolithography has been making rapid progress toward finer fabrication. In the next generation of semiconductor production processes, microfabrication with feature sizes at 60 nm to 45 nm, and further, microfabrication with feature sizes of 32 nm or less will be required. In order to meet the demand for microfabrication with feature sizes of 32 nm or less, for example, an exposure apparatus is needed in which a system for generating EUV light at a wavelength of approximately 13 nm is combined with a reduced projection reflective optical system.

Three kinds of systems for generating EUV light are known in general, which include a Laser Produced Plasma (LPP) type system in which plasma is generated by irradiating a target material with a laser beam, a Discharge Produced Plasma (DPP) type system in which plasma is generated by electric discharge, and a Synchrotron Radiation (SR) type system in which orbital radiation is used.

SUMMARY

An apparatus for generating extreme ultraviolet light according to one aspect of this disclosure may include: a chamber having an opening through which a laser beam is introduced into the chamber; a reference member on which the chamber is mounted; a target supply unit for supplying the target material to be irradiated by the laser beam to a predetermined region inside the chamber; a laser beam focusing optical system for focusing the laser beam in the predetermined region inside the chamber to turn the target material into plasma; and a collector mirror for collecting the extreme ultraviolet light emitted from the plasma.

BRIEF DESCRIPTION OF THE DRAWINGS

Hereinafter, selected embodiments of this disclosure will be described with reference to the accompanying drawings.

DESCRIPTION OF PREFERRED EMBODIMENTS

Figure 1:
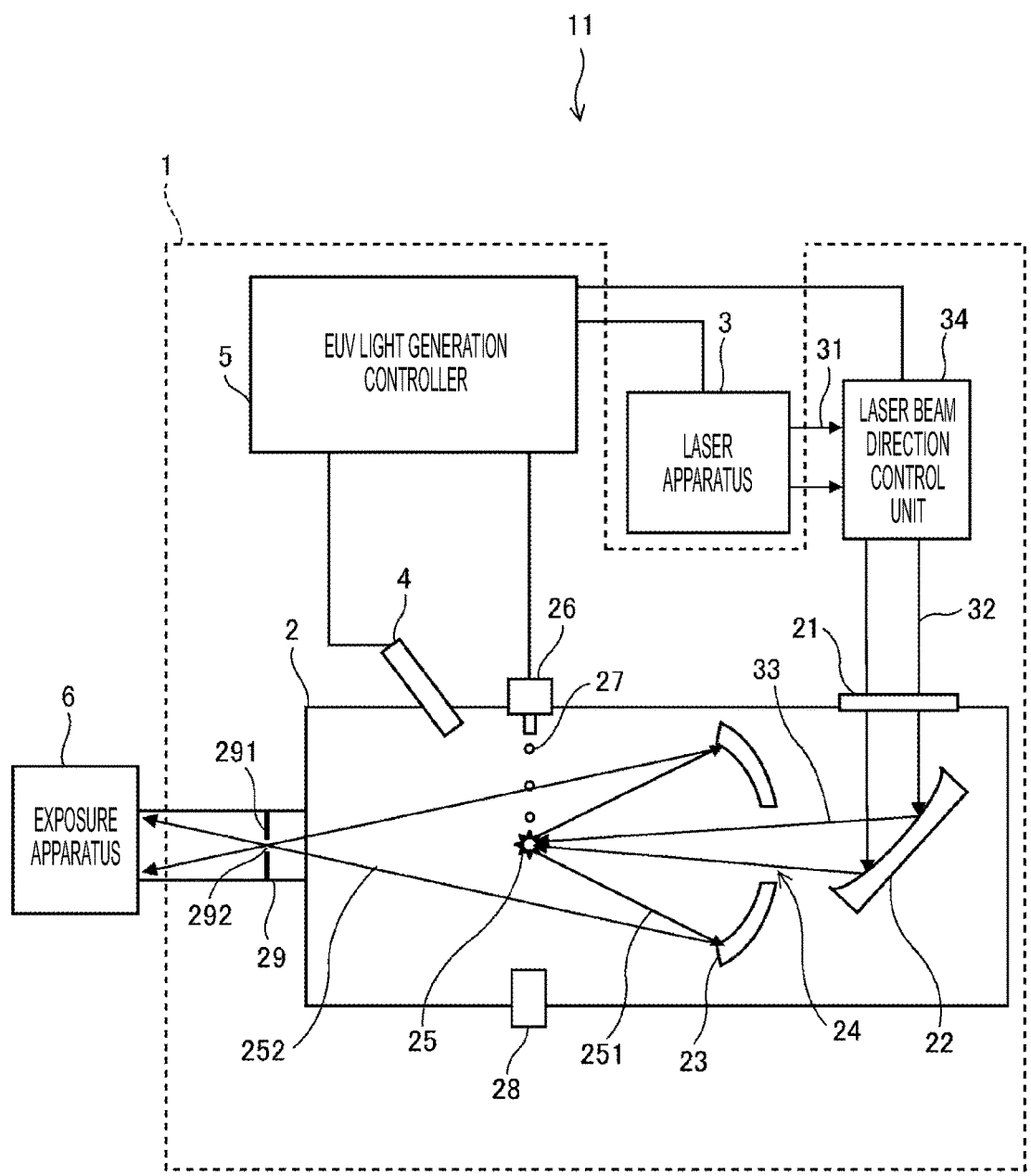
FIG. 1 schematically illustrates the configuration of an exemplary LPP type EUV light generation system.

Hereinafter, selected embodiments of this disclosure will be described in detail with reference to the accompanying drawings. The embodiments to be described below are merely illustrative in nature and do not limit the scope of this disclosure. Further, the configuration(s) and operation(s) described in each embodiment are not all essential in implementing this disclosure. Note that like elements are referenced by like reference numerals and characters, and duplicate descriptions thereof will be omitted herein. The embodiments of this disclosure will be illustrated following the table of contents below.

Contents
1. Overview
2. Overview of EUV Light Generation System
2.1 Configuration
2.2 Operation
3. EUV Light Generation Apparatus and Exposure Apparatus: First Embodiment
3.1 Configuration
3.2 Operation
3.3 Effect
4. EUV Light Generation Apparatus: Second Embodiment
5. EUV Light Generation Apparatus: Third Embodiment
6. Laser Beam Path Control Unit for Introducing Laser Beam into EUV Light Generation Apparatus: Fourth Embodiment
7. EUV Light Generation Apparatus in which Pre-Pulse Laser Beam is Used: Fifth Embodiment
8. Laser Beam Path Control Unit for Introducing Two Laser Beams into EUV Light Generation Apparatus: Sixth Embodiment
9. Laser Beam Path Control Unit for Introducing Two Laser Beams into EUV Light Generation Apparatus: Seventh Embodiment
10. Supplementary Descriptions
10.1 Laser Beam Measuring Device
10.2 Laser Beam Travel Direction Adjusting Mechanism 1. Overview In an LPP type EUV light generation apparatus, a target material may be supplied to a plasma generation region defined inside a chamber, and the target material may be irradiated by a laser beam. Upon being irradiated by the laser beam, the target material may be turned into plasma, and EUV light may be emitted from the plasma. The emitted EUV light may be collected by an EUV collector mirror provided inside the chamber, and outputted to an external apparatus, such as an exposure apparatus. However, when the relative position of the EUV collector mirror and a laser beam focusing optical system changes, the position where the EUV light is focused before being outputted to the exposure apparatus may also change.

Accordingly, in one or more of the embodiments of this disclosure, at least the EUV collector mirror may be fixed to a reference member on which the chamber is mounted, in an LPP type EUV light generation apparatus. Further, in one or more of the embodiments of this disclosure, the laser beam focusing optical system for focusing a laser beam in the plasma generation region may be fixed to the reference member. Furthermore, in one or more of the embodiments of this disclosure, a laser beam introduction optical system for introducing a laser beam into the chamber may be fixed to the reference member, to which the laser beam focusing optical system is also fixed. Further, in one or more of the embodiments of this disclosure, a laser beam measuring device for measuring a laser beam guided to the laser beam introduction optical system may be fixed to the reference member. As a result of the above configuration(s), change in the relative position of the respective optical elements may be suppressed.

2. Overview of EUV Light Generation System 2.1 Configuration

FIG. 1 schematically illustrates the configuration of an exemplary LPP type EUV light generation system. An LPP type EUV light generation apparatus may be used with at least one laser apparatus 3. Hereinafter, a system that includes the EUV light generation apparatus 1 and the laser apparatus 3 may be referred to as an EUV light generation system 11. As illustrated in FIG. 1 and described in detail below, the EUV light generation system 11 may include a chamber 2, a target supply unit 26 and so forth. The chamber 2 may be airtightly sealed. The target supply unit 26 may be mounted to the chamber 2 so as to, for example, penetrate a wall of the chamber 2. A target material 27 to be supplied by the target supply unit 26 may include, but is not limited to, tin, terbium, gadolinium, lithium, xenon, or any combination thereof.

The chamber 2 may have at least one through-hole or opening formed in its wall, and a pulse laser beam 32 may travel through the through-hole/opening into the chamber 2. Alternatively, the chamber 2 may be provided with a window 21, through which the pulse laser beam 32 may travel into the chamber 2. An EUV collector mirror 23 having a spheroidal surface may be disposed inside the chamber 2, for example. The EUV collector mirror 23 may have a multi-layered reflective film formed on the spheroidal surface thereof. The reflective film may include a molybdenum layer and a silicon layer being laminated alternately. The EUV collector mirror 23 may have a first focus and a second focus, and preferably be disposed such that the first focus lies in a plasma generation region 25 and the second focus lies in an intermediate focus (IF) region 292 defined by the specification of an external apparatus, such as an exposure apparatus 6. The EUV collector mirror 23 may have a through-hole 24 formed at the center thereof, and a pulse laser beam 33 may travel through the through-hole 24 toward the plasma generation region 25.

The EUV light generation system 11 may further include an EUV light generation controller 5 and a target sensor 4. The target sensor 4 may have an imaging function and detect at least one of the presence, the trajectory, and the position of a target 27.

Further, the EUV light generation system 11 may include a connection part 29 for allowing the interior of the chamber 2 and the interior of the exposure apparatus 6 to be in communication with each other. A wall 291 having an aperture may be provided inside the connection part 29, and the wall 291 may be positioned such that the second focus of the EUV collector mirror 23 lies in the aperture formed in the wall 291.

The EUV light generation system 11 may also include a laser beam direction control unit 34, a laser beam focusing mirror 22, and a target collector 28 for collecting targets 27. The laser beam direction control unit 34 may include an optical element for defining the direction into which the pulse laser beam 32 travels and an actuator for adjusting the position and the orientation (posture) of the optical element.

2.2 Operation

With continued reference to FIG. 1, a pulse laser beam 31 outputted from the laser apparatus 3 may pass through the laser beam direction control unit 34 and be outputted therefrom as a pulse laser beam 32 after having its direction optionally adjusted. The pulse laser beam 32 may travel through the window 21 and enter the chamber 2. The pulse laser beam 32 may travel inside the chamber 2 along at least one beam path from the laser apparatus 3, be reflected by the laser beam focusing mirror 22, and strike at least one target 27 as a pulse laser beam 33.

The target supply unit 26 may be configured to output the target(s) 27 toward the plasma generation region 25 inside the chamber 2. The target 27 may be irradiated by at least one pulse of the pulse laser beam 33. Upon being irradiated by the pulse laser beam 33, the target 27 may be turned into plasma, and rays of light including EUV light 251 may be emitted from the plasma. The EUV light 251 may be reflected selectively by the EUV collector mirror 23. EUV light 252 reflected by the EUV collector mirror 23 may travel through the intermediate focus region 292 and be outputted to the exposure apparatus 6. The target 27 may be irradiated by multiple pulses included in the pulse laser beam 33.

The EUV light generation controller 5 may be configured to integrally control the EUV light generation system 11. The EUV light generation controller 5 may be configured to process image data of the target 27 captured by the target sensor 4. Further, the EUV light generation controller 5 may be configured to control at least one of the timing at which the target 27 is outputted and the direction into which the target 27 is outputted (e.g., the timing at which and/or direction in which the target 27 is outputted from target supply unit 26). Furthermore, the EUV light generation controller 5 may be configured to control at least one of the timing at which the laser apparatus 3 oscillates (e.g., by controlling the laser apparatus 3), the direction in which the pulse laser beam 31 travels (e.g., by controlling the laser beam direction control unit 34), and the position at which the pulse laser beam 33 is focused (e.g., by controlling the laser apparatus 3, the laser beam direction control unit 34, or the like). It will be appreciated that the various controls mentioned above are merely examples, and other controls may be added as necessary.

Figure 2A:
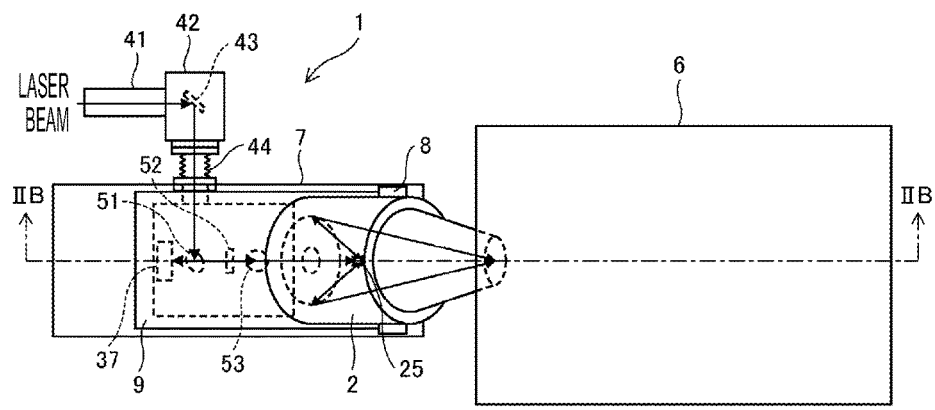
FIG. 2A is a plan view illustrating an EUV light generation apparatus according to a first embodiment, the EUV light generation apparatus being connected to an exposure apparatus.
Figure 2B:
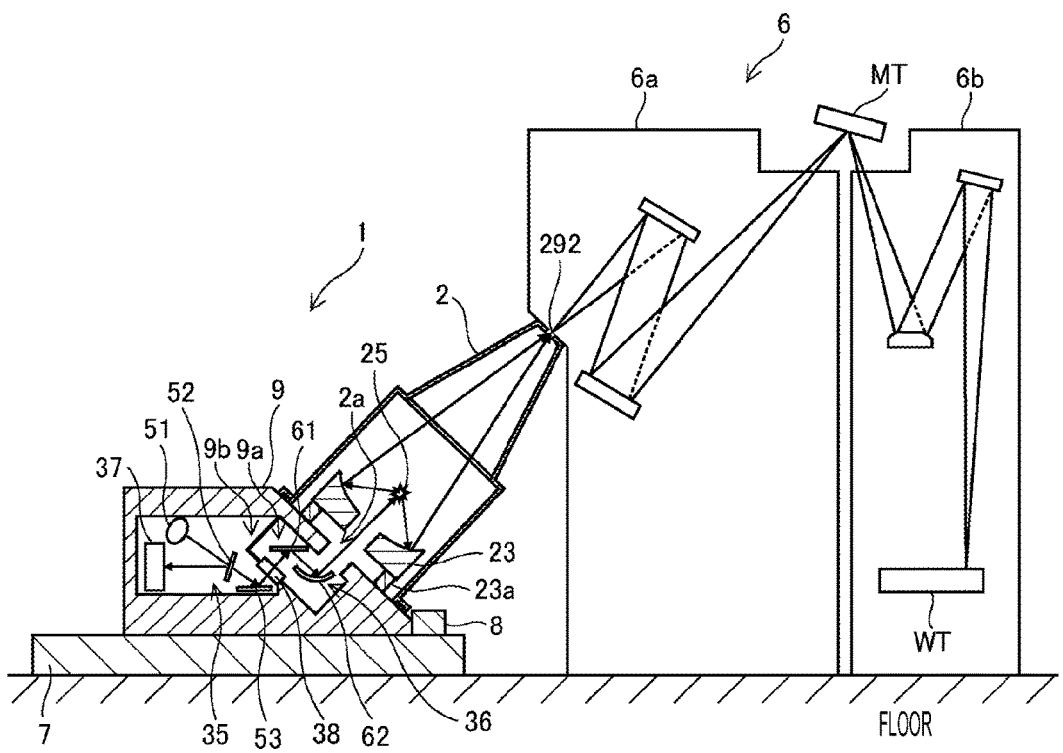
FIG. 2B is a sectional view of the EUV light generation apparatus and the exposure apparatus shown in FIG. 2A, taken along IIB-IIB plane.

3. EUV Light Generation Apparatus and Exposure Apparatus: First Embodiment 3.1 Configuration FIG. 2A is a plan view illustrating an EUV light generation apparatus according to a first embodiment, the EUV light generation apparatus being connected to an exposure apparatus. FIG. 2B is a sectional view of the EUV light generation apparatus and the exposure apparatus shown in FIG. 2A, taken along IIB-IIB plane.

As shown in FIGS. 2A and 2B, the EUV light generation apparatus 1 may include a moving mechanism 7, a positioning mechanism 8, a reference member 9, a laser beam introduction optical system 35, a laser beam focusing optical system 36, a laser beam measuring device 37, and the chamber 2. A floor surface shown in FIG. 2B may serve as a reference plane, on which the EUV light generation apparatus 1 and the exposure apparatus 6 may be installed. The reference member 9 may be supported by the moving mechanism 7 installed on the floor surface serving as the reference plane. Primary components of the EUV light generation apparatus 1 may be movable along with the moving mechanism 7 with respect to the exposure apparatus 6. The configuration and the operation of the moving mechanism 7 will be described later in detail. The reference member 9 may be positioned with respect to the exposure apparatus 6 and/or the moving mechanism 7 by the positioning mechanism 8, and the EUV light generation apparatus 1 may be connected to the exposure apparatus 6 accordingly.

As shown in FIG. 2B, the chamber 2 may have an opening 2a through which a laser beam is introduced into the chamber 2. The chamber 2 may be mounted onto the reference member 9 such that the opening 2a is covered by the reference member 9. For example, a slanted surface may be formed on the reference member 9, and the chamber 2 may be mounted onto the slanted surface of the reference member 9. The target supply unit 26 (see FIG. 1) may be mounted to the chamber 2.

The EUV collector mirror 23 may be provided inside the chamber 2. The EUV collector mirror 23 may be attached to slanted surface of the reference member 9 through an EUV collector mirror mount 23a. The laser beam introduction optical system 35, the laser beam focusing optical system 36, and the laser beam measuring device 37 may also be fixed to the reference member 9.

The reference member 9 may include a storing chamber 9a, which is in communication with the chamber 2 through the opening 2a, formed in the chamber 2, and a storing chamber 9b adjacent to the storing chamber 9a. The laser beam focusing optical system 36 may be housed in the storing chamber 9a, and the laser beam introduction optical system 35 and the laser beam measuring device 37 may be housed in the storing chamber 9b. A window 38 may be provided between the storing chamber 9a and the storing chamber 9b. With this, the chamber 2 may be airtightly sealed.

An optical unit 42 may be attached to the reference member 9 through a flexible pipe 44. A beam-path tube 41 may be connected to the optical unit 42 such that a laser beam from a laser apparatus 30 (see FIG. 5B) may travel through the beam-path tube 41 into the optical unit 42. At least one high-reflection mirror 43 may be provided in the optical unit 42. The high-reflection mirror 43 may be positioned such that the laser beam guided into the optical unit 42 is reflected by the high-reflection mirror 43 so as to enter the storing chamber 9b through the flexible pipe 44.

Inside the storing chamber 9b, the laser beam introduction optical system 35 may be positioned to introduce the laser beam from the optical unit 42 into the storing chamber 9a through the window 38. The laser beam introduction optical system 35 may, for example, include a high-reflection mirror 51, a beam splitter 52, a high-reflection mirror 53, and holders for these optical elements.

The high-reflection mirror 51 may be positioned to reflect the laser beam from the optical unit 42 toward the beam splitter 52. The beam splitter 52 may be positioned to transmit most of the laser beam incident thereon toward the high-reflection mirror 53 with high transmittance and to reflect a part of the laser beam toward the laser beam measuring device 37. The high-reflection mirror 53 may be positioned to reflect the laser beam incident thereon toward the window 38 (and into the storing chamber 9a).

Inside the storing chamber 9a, the laser beam focusing optical system 36 may be positioned to focus the laser beam introduced into the storing chamber 9a by the laser beam introduction optical system 35 into the plasma generation region 25. The laser beam focusing optical system 36 may, for example, include a high-reflection mirror 61, a laser beam focusing mirror 62, and holders for these mirrors.

The high-reflection mirror 61 may be positioned to reflect the laser beam from the laser beam introduction optical system 35 toward the laser beam focusing mirror 62. The laser beam focusing mirror 62 may, for example, be an off-axis paraboloidal mirror, and may be positioned to focus the laser beam from the high-reflection mirror 61 into the plasma generation region 25.

The exposure apparatus 6 may, for example, include a mask irradiation part 6a and a workpiece irradiation part 6b. The mask irradiation part 6a may be an optical system for irradiating a mask on a mask table MT by EUV light, and may include a plurality of high-reflection mirrors. The workpiece irradiation part 6b may be an optical system for projecting an image on the mask onto a workpiece (e.g., semiconductor wafer) on a workpiece table WT, and may include a plurality of high-reflection mirrors.

3.2 Operation

With the above configuration, a laser beam from a laser apparatus may be reflected by the high-reflection mirror 43 and then be incident on the high-reflection mirror 51. The laser beam reflected by the high-reflection mirror 51 may then be incident on the beam splitter 52. Most of the laser beam incident on the beam splitter 52 may be transmitted therethrough, and the transmitted component of the laser beam may be incident on the high-reflection mirror 53. A part of the laser beam incident on the beam splitter 52 may be reflected thereby, and the reflected component of the laser beam may enter the laser beam measuring device 37. The laser beam measuring device 37 may be configured to measure the cross-sectional beam intensity profile, the pointing, and the divergence of the entering laser beam.

The laser beam reflected by the high-reflection mirror 53 may then be reflected sequentially by the high-reflection mirror 61 and the laser beam focusing mirror 62, and may enter the chamber 2 through the through-hole formed in the reference member 9 and the opening 2a. Further, the laser beam that has entered the chamber 2 may pass through a through-hole 24 as shown in FIG. 1, formed in the EUV collector mirror 23 and be focused in the plasma generation region 25.

The laser beam may be focused on a target 27 formed of target material supplied by the target supply unit 26 in the plasma generation region 25. With this, the target material may be turned into plasma, and EUV light may be emitted from the plasma. The emitted EUV light may be reflected by the EUV collector mirror 23 so as to be focused in the intermediate focus region 292 and then be outputted to the exposure apparatus 6.

Inside the exposure apparatus 6, a mask on the mask table MT may be irradiated by the EUV light through the mask irradiation part 6a. Further, the EUV light reflected by the mask may be imaged on a workpiece (e.g., semiconductor wafer) on the workpiece table WT through the workpiece irradiation part 6b. Here, by transitionally moving the mask table MT and the workpiece table WT simultaneously, the pattern on the mask may be transferred onto the workpiece.

3.3 Effect

With the configuration according to the first embodiment, change in the relative position and orientation of the respective optical elements may be suppressed. Fixing the optical unit 42, the laser beam introduction optical system 35, and the laser beam focusing optical system 36 to the reference member 9 may allow a beam path of a laser beam from a laser apparatus to be stabilized, and a position at which the laser beam is focused inside the chamber 2 may be stabilized accordingly. Further, fixing the EUV collector mirror 23 to the reference member 9, to which the laser beam introduction optical system 36 and the laser beam focusing optical system 36 are fixed, may allow the focus of the laser beam to overlap the first focus of the EUV collector mirror 23 with high precision. With this, the precision with which the EUV light is focused in the intermediate focus region 292 may be improved. Consequently, by positioning the reference member 9 with respect to the exposure apparatus 6, a stable EUV light may be supplied to the exposure apparatus 6.

4. EUV Light Generation Apparatus: Second Embodiment

Figure 3A:
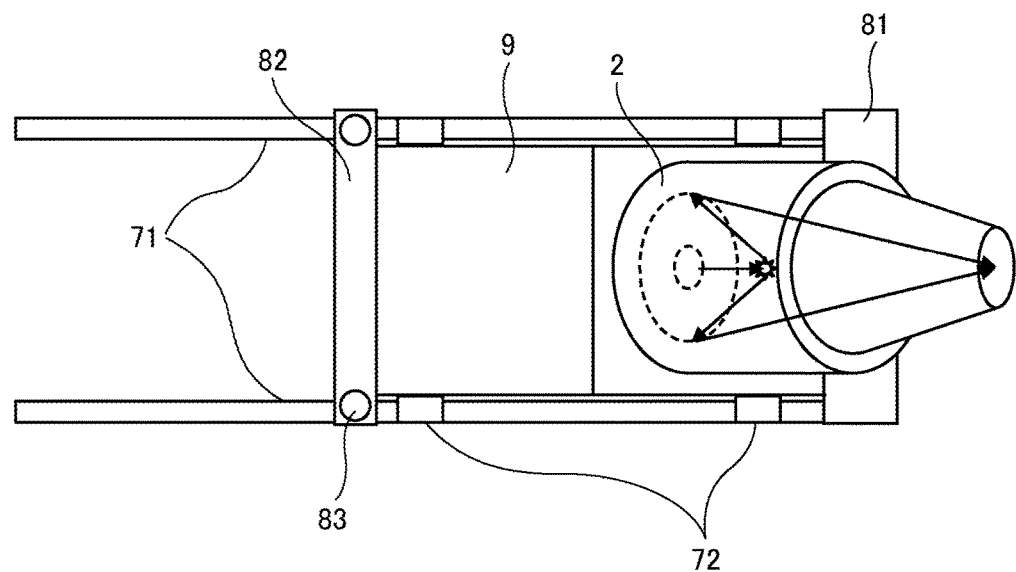
FIG. 3A is a plan view illustrating an EUV light generation apparatus according to a second embodiment.
Figure 3B:
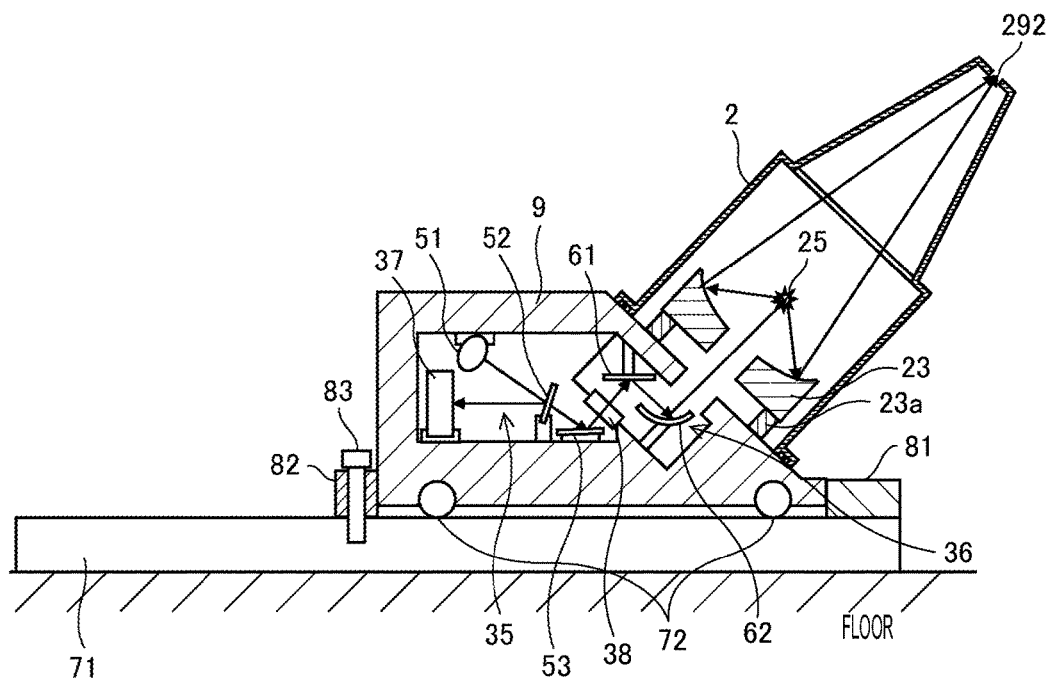
FIG. 3B is a sectional view illustrating the EUV light generation apparatus according to the second embodiment.

FIG. 3A is a plan view illustrating an EUV light generation apparatus according to a second embodiment. FIG. 3B is a sectional view illustrating the EUV light generation apparatus according to the second embodiment. In the second embodiment, guide rails 71 and wheels 72 may be used as the moving mechanism 7, and a positioning block 81, a fixing plate 82, and bolts (or pins) 83 may be used as the positioning mechanism 8 of the first embodiment shown in FIGS. 2A and 2B. Here, the wheels 72 may be replaced by casters provided with wheels. Other configurations and operations may be similar to those of the first embodiment.

As shown in FIGS. 3A and 3B, two guide rails 71 may be installed on a floor which serves as the reference plane. The wheels 72 may be rotatably attached to the reference member 9. The wheels 72 may rotate on the guide rails 71, whereby the primary components of the EUV light generation apparatus 1 may be movable with respect to the exposure apparatus 6. In this way, using the guide rails 71 and the wheels 72 may allow the reference member 9 to be moved with ease.

Here, the reference member 9 may be positioned by making a first surface (right-side surface in FIG. 3A) of the reference member 9 facing the exposure apparatus 6 abut against the positioning block 81. In addition, the reference member 9, after being positioned, may be prevented from moving by making a second surface of the reference member 9 opposite to the first surface abut against the fixing plate 82 and fixing the fixing plate 82 to the guide rails 71 by the bolts (or the pins) 83.

5. EUV Light Generation Apparatus: Third Embodiment

Figure 4A:
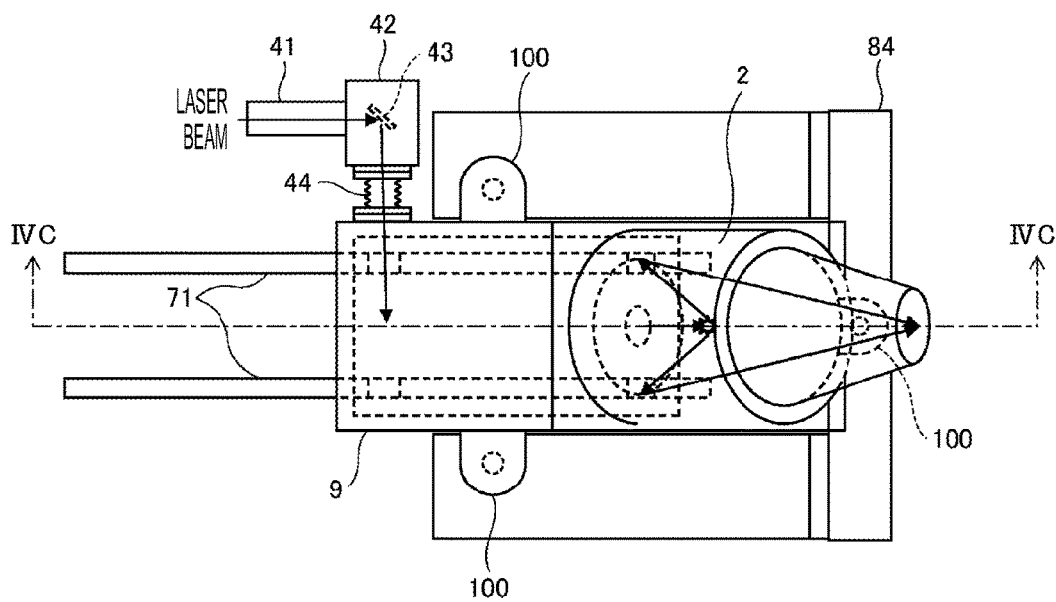
FIG. 4A is a plan view illustrating an EUV light generation apparatus according to a third embodiment.
Figure 4B:
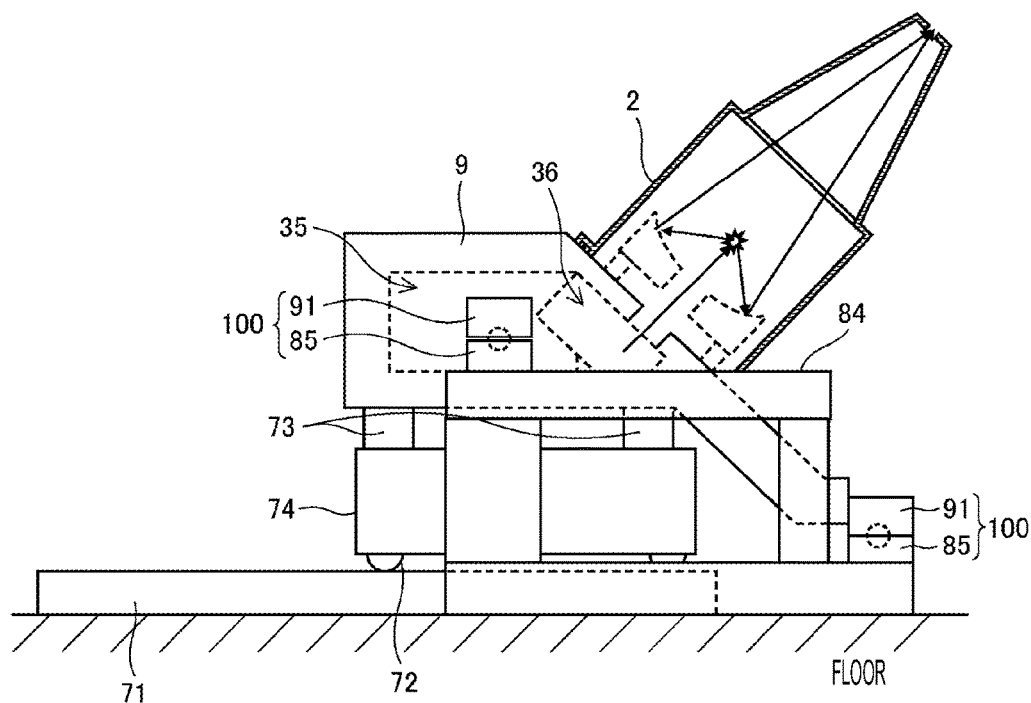
FIG. 4B is a side view illustrating the EUV light generation apparatus according to the third embodiment.
Figure 4C:
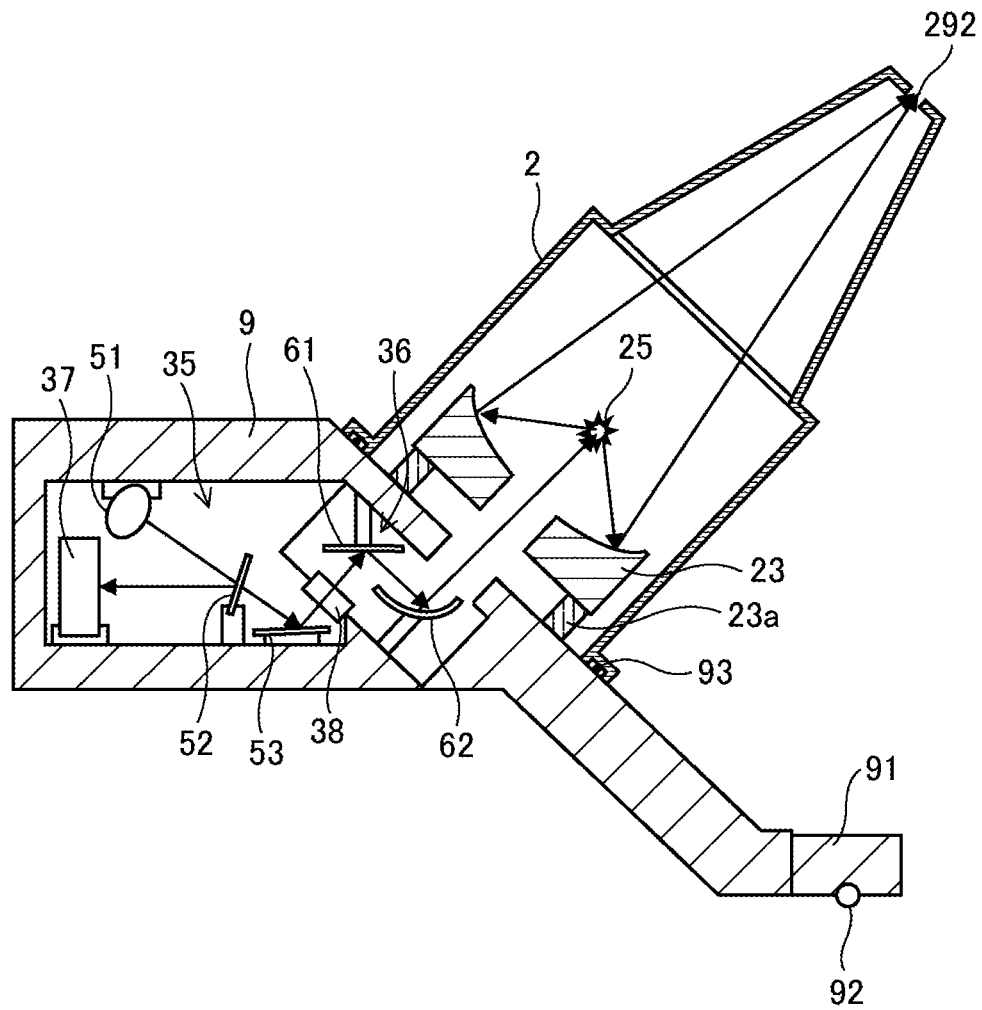
FIG. 4C is a sectional view of the EUV light generation apparatus shown in FIG. 4A, taken along IVC-IVC plane.

FIG. 4A is a plan view illustrating an EUV light generation apparatus according to a third embodiment. FIG. 4B is a side view illustrating the EUV light generation apparatus according to the third embodiment. FIG. 4C is a sectional view of the EUV light generation apparatus shown in FIG. 4A, taken along IVC-IVC plane.

In the third embodiment, the guide rails 71 and a carriage 74 that includes the wheels 72 and air cylinders 73 may be used as the moving mechanism 7 of the first embodiment shown in FIGS. 2A and 2B. Further, a positioning stage 84 may be used as the positioning mechanism 8 of the first embodiment shown in FIGS. 2A and 2B. The reference member 9 may be disposed on the positioning stage 84 via at least three kinematic mounts 100. Further, as shown in FIG. 4C, an 0-ring seal 93 may be used at the connection between the chamber 2 and the reference member 9.

As shown in FIGS. 4A and 4B, two guide rails 71 may be installed on a floor which serves as the reference plane. The reference member 9 may be disposed on the air cylinders 73 of the carriage 74. The wheels 72 may be rotatably attached to the carriage 74. The wheels 72 may rotate on the guide rails 71, whereby the primary components of the EUV light generation apparatus 1 may be movable with respect to the exposure apparatus 6.

In the third embodiment, when the reference member 9 is to be disposed on the positioning stage 84, the reference member 9 may be lowered using the air cylinders 73 of the carriage 74. With this, the reference member 9 may be supported by the positioning stage 84 via the kinematic mounts 100.

Each of the kinematic mounts 100 may include a housing member 85, a housing member 91, and internal spherical body 92. The housing member 85 may be integrated into or attached to the positioning stage 84, and the housing member 91 may be integrated into or attached to the reference member 9. The internal spherical body 92 may be provided between the housing member 85 and the housing member 91. Here, a v-shaped groove may be formed in the housing member 85 (or 91). With this, the kinematic mounts 100 may absorb displacement caused by structural deformation, thermal deformation, or the like generated between the positioning stage 84 and the reference member 9. Accordingly, the reference member 9 may remain positioned precisely with respect to the positioning stage 84.

Figure 4D:
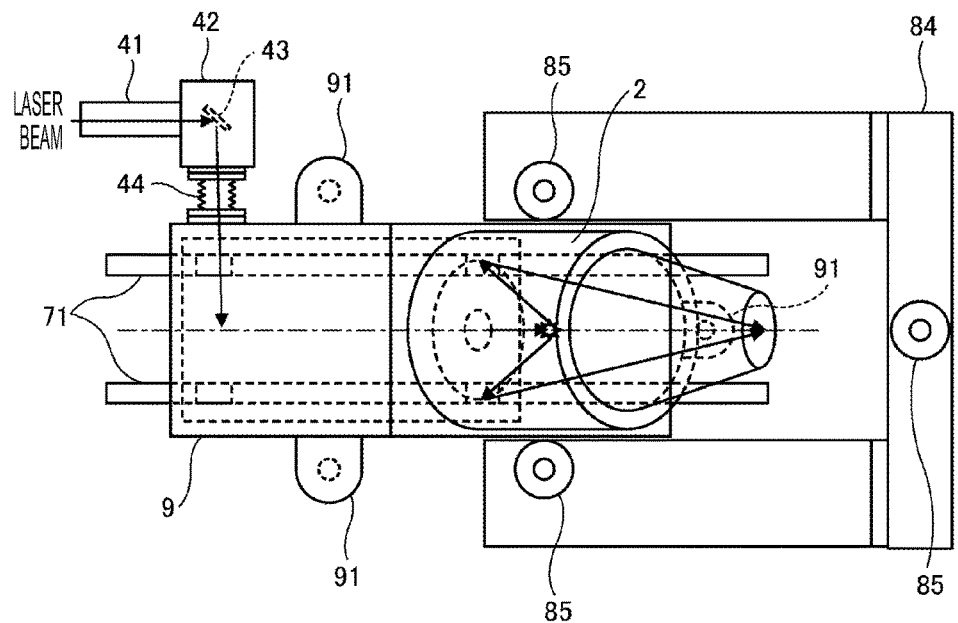
FIG. 4D is a plan view illustrating the EUV light generation apparatus according to the third embodiment in a state in which a reference member is moved away from an exposure apparatus.
Figure 4E:
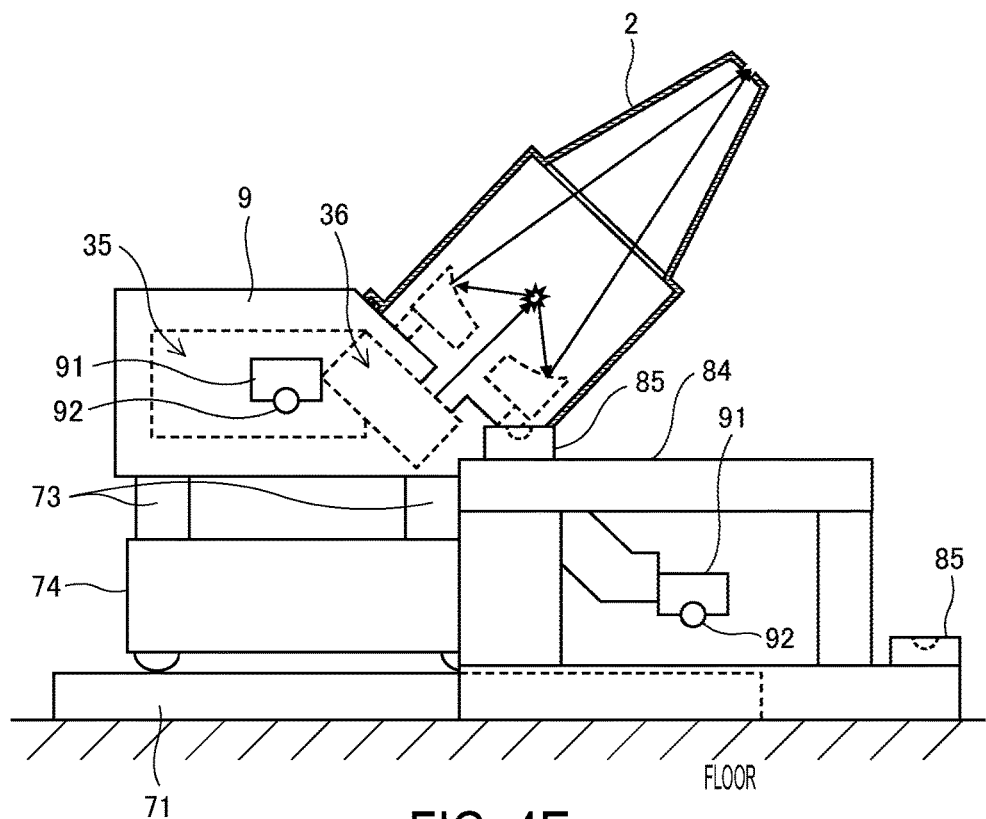
FIG. 4E is a side view illustrating the EUV light generation apparatus according to the third embodiment in a state in which the reference member is moved away from an exposure apparatus.

FIG. 4D is a plan view illustrating the EUV light generation apparatus according to the third embodiment in a state in which the reference member is moved away from the exposure apparatus. FIG. 4E is a side view illustrating the EUV light generation apparatus according to the third embodiment in a state in which the reference member is moved away from the exposure apparatus. When the chamber 2 is to be detached from the exposure apparatus 6 for maintenance work, the reference member 9 may be raised using the air cylinders 73 of the carriage 74, and the housing member 91 along with the internal spherical body 92 may be detached from the housing member 85. Thereafter, the carriage 74 on which the reference member 9 is placed may be moved horizontally. In this example, the internal spherical body 92 may move along with the housing member 91, but the configuration may be such that the internal spherical body 92 remains on the housing member 85.

Figure 5A:
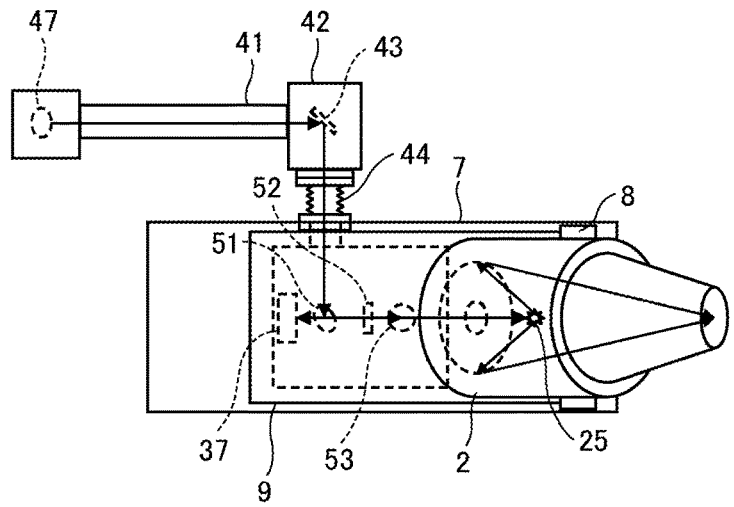
FIG. 5A is a plan view illustrating an EUV light generation apparatus according to a fourth embodiment, which includes a laser beam path control unit for introducing a laser beam into the EUV light generation apparatus.
Figure 5B:
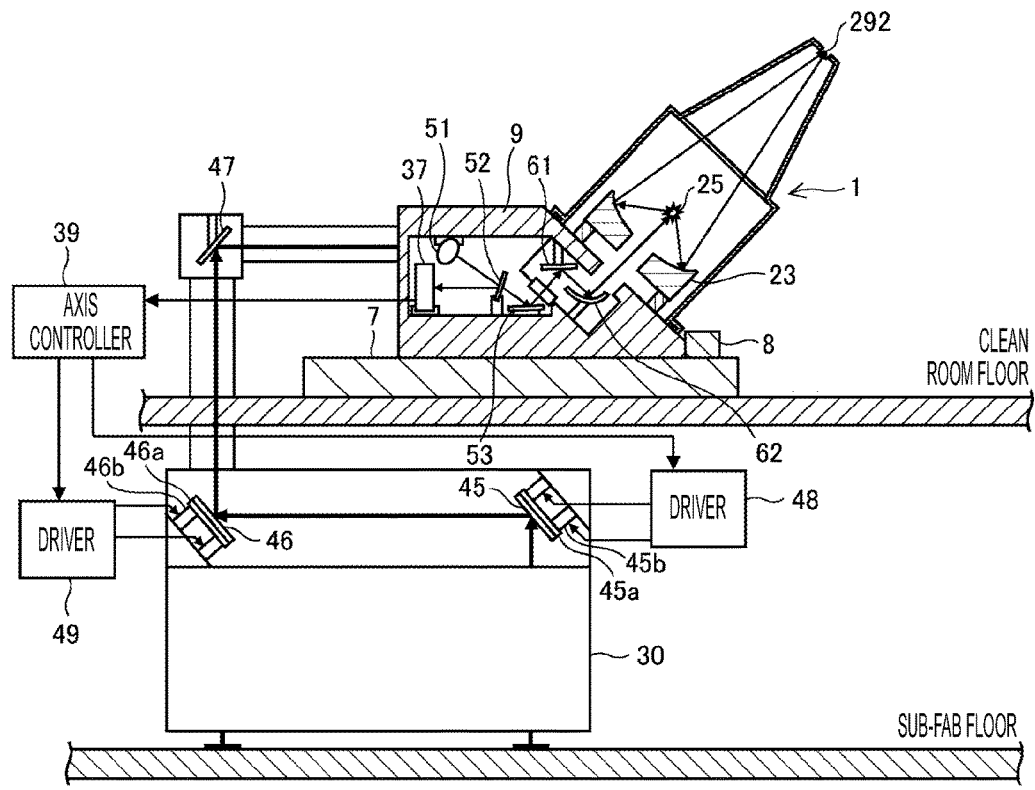
FIG. 5B is a sectional view of the EUV light generation apparatus and the laser beam path control unit shown in FIG. 5A.

6. Laser Beam Path Control Unit for Introducing Laser Beam into EUV Light Generation Apparatus: Fourth Embodiment A laser beam path control unit may be configured to control a beam path of a laser beam introduced into the EUV light generation apparatus. FIG. 5A is a plan view illustrating an EUV light generation apparatus according to a fourth embodiment which includes a laser beam path control unit. FIG. 5B is a sectional view of the EUV light generation apparatus and the laser beam path control unit shown in FIG. 5A. In the fourth embodiment, the laser beam path control unit may be used to control the beam path of the laser beam from the laser apparatus 30 to the EUV light generation apparatus 1. The EUV light generation apparatus 1 may be similar in configuration to any of the first through third embodiments. As shown in FIG. 5B, the EUV light generation apparatus 1 may be installed on a clean room floor, and the laser apparatus 30 may be installed on a sub-fab floor.

The laser beam from the laser apparatus 30 may be reflected sequentially by the high reflection mirrors, 45, 46, 47, and 43, and enter the reference member 9. The high-reflection mirrors 45 and 46 may respectively be provided with mirror holders 45a and 46a which respectively include actuators 45b and 46b. A mechanism including the high-reflection mirrors 45 and 46, the mirror holders 45a and 46a, and the actuators 45b and 46b may be referred to herein as a laser beam travel direction adjusting mechanism.

Drivers 48 and 49 may be configured to drive the respective actuators 45b and 46b, whereby the orientation (posture) of the high-reflection mirrors 45 and 46 may be adjusted by the respective actuators 45b and 46b. A laser beam axis controller 39 may calculate the center in the cross-section of the laser beam from the measurement result of the laser beam measuring device 37. The laser beam axis controller 39 may control the drivers 48 and 49 based on the calculation result, whereby the orientation (posture) of the high-reflection mirrors 45 and 46 may be controlled, and the laser beam may be guided to a predetermined position inside the reference member 9 at a predetermined angle. Here, the laser beam measuring device 37, the laser beam axis controller 39, the drivers 48 and 49, and the above-described laser beam travel direction adjusting mechanism may constitute the laser beam path control unit.

Figure 6:
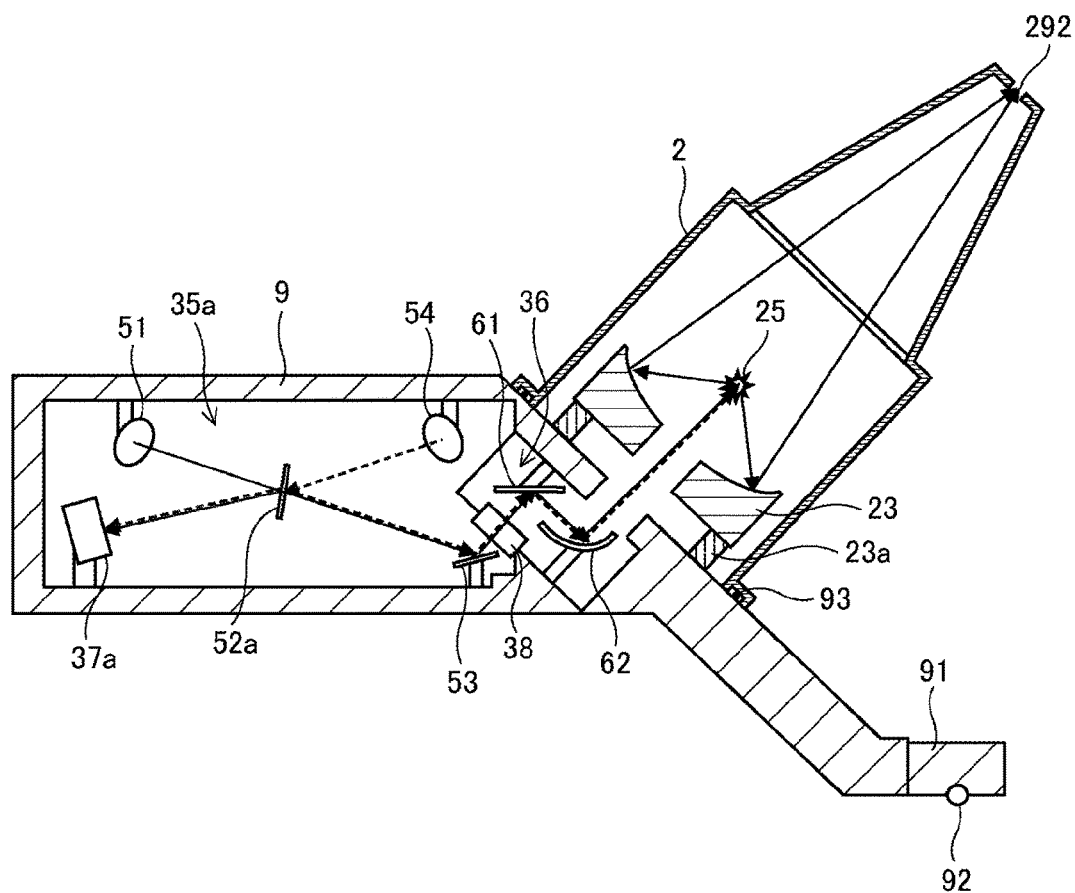
FIG. 6 is a sectional view of an EUV light generation apparatus according to a fifth embodiment, in which a pre-pulse laser beam is used.

7. EUV Light Generation Apparatus in which Pre-Pulse Laser Beam is Used: Fifth Embodiment FIG. 6 is a sectional view of an EUV light generation apparatus according to a fifth embodiment, in which a pre-pulse laser beam is used. The fifth embodiment may be a modification of any of the first through third embodiments. The fifth embodiment to be described below is a modification of the EUV light generation apparatus of the third embodiment which includes at least three kinematic mounts.

In the fifth embodiment, a primary target may be irradiated by a pre-pulse laser beam to be turned into a secondary target, and the secondary target may be irradiated by a main pulse laser beam to be turned into plasma. For example, a yttrium aluminum garnet (YAG) laser apparatus may be used to generate the pre-pulse laser beam, and a carbon dioxide (C02) gas laser apparatus may be used the generate the main pulse laser beam.

As shown in FIG. 6, a laser beam introduction optical system 35a, the laser beam focusing optical system 36, and a laser beam measuring device 37a may be provided inside the reference member 9. The laser beam introduction optical system 35a shown in FIG. 6 may differ from the laser beam introduction optical system 35 shown in FIG. 4C in that a high-reflection mirror 54 for introducing the pre-pulse laser beam (broken line) is additionally provided, and the high-reflection mirror 51 is provided to introduce the main pulse laser beam (solid line)

The high-reflection mirror 54 may be configured to reflect the pre-pulse laser beam with high reflectance. The high-reflection mirror 51 may be configured to reflect the main pulse laser beam with high reflectance. The pre-pulse laser beam reflected by the high-reflection mirror 54 may be incident on a first surface (the right side surface in FIG. 6) of a beam splitter 52a, and the main pulse laser beam reflected by the high-reflection mirrors 51 may be incident on a second surface (the left side surface in FIG. 6) of the beam splitter 52a.

The beam splitter 52a be positioned to reflect the pre-pulse laser beam incident on the first surface thereof toward the high-reflection mirror 53 with high reflectance and to transmit a part of the pre-pulse laser beam incident thereon toward the laser beam measuring device 37a. Further, the beam splitter 52 may be positioned to transmit the main pulse laser beam incident on the second surface thereof toward the high-reflection mirror 53 with high transmittance and to reflect a part of the main pulse laser beam incident thereon toward the laser beam measuring device 37a.

The pre-pulse laser beam reflected by the beam splitter 52a and the main pulse laser beam transmitted through the beam splitter 52a may both be incident on the high-reflection mirror 53. The high-reflection mirror 53 may be positioned to reflect the pre-pulse laser beam and the main pulse laser beam incident thereon toward the laser beam focusing optical system 36.

The pre-pulse laser beam transmitted through the beam splitter 52a and the main pulse laser beam reflected by the beam splitter 52a may enter the laser beam measuring device 37a. The laser beam measuring device 37a may be configured to measure the cross-sectional beam intensity profile, the pointing, and the divergence of each of the pre-pulse laser beam and the main pulse laser beam entering the laser beam measuring device 37a. Here, the laser beam measuring device 37a may include a pre-pulse laser beam measuring device for measuring the pre-pulse laser beam and a main pulse laser beam measuring device for measuring the main pulse laser beam.

In this way, the pre-pulse laser beam and the main pulse laser beam may be adjusted to travel into substantially the same direction by the beam splitter 52a. In this regard, the beam splitter 52a may serve as a beam combiner to make the travel direction of the pre-pulse laser beam and the travel direction of the main pulse laser beam coincide with each other. The beam splitter 52a may, for example, be formed of diamond. The first surface of the beam splitter 52a may be coated with an optical thin-film that reflects the pre-pulse laser beam with high reflectance and transmit the main pulse laser beam with high transmittance.

Each of the pre-pulse laser beam and the main pulse laser beam that have entered the laser beam focusing optical system 36 may be reflected sequentially by the high-reflection mirror 61 and the laser beam focusing mirror 62 with high reflectance. With this, the pre-pulse laser beam may be focused on a primary target in the plasma generation region 25, and the main pulse laser beam may be focused on a secondary target in the plasma generation region 25.

Alternatively, the pre-pulse laser beam may be introduced into the reference member 9 via the high-reflection mirror 51, and the main pulse laser beam may be introduced into the reference member 9 via the high-reflection mirror 54. In that case, the beam splitter 52a may be positioned to transmit the pre-pulse laser beam incident on the second surface thereof toward the high-reflection mirror 53 with high transmittance and to reflect a part of the pre-pulse laser beam incident thereon toward the laser beam measuring device 37a. Further, the beam splitter 52a may be positioned to reflect the main pulse laser beam incident on the first surface thereof toward the high-reflection mirror 53 with high reflectance and to transmit a part of the main pulse laser beam incident thereon toward the laser beam measuring device 37a.

According to the fifth embodiment, even in the case where the pre-pulse laser beam and the main pulse laser beam are introduced into the reference member 9 and into the chamber 2, fixing the respective optical elements to the reference member 9 may yield similar effects as the first embodiment.

Figure 7A:
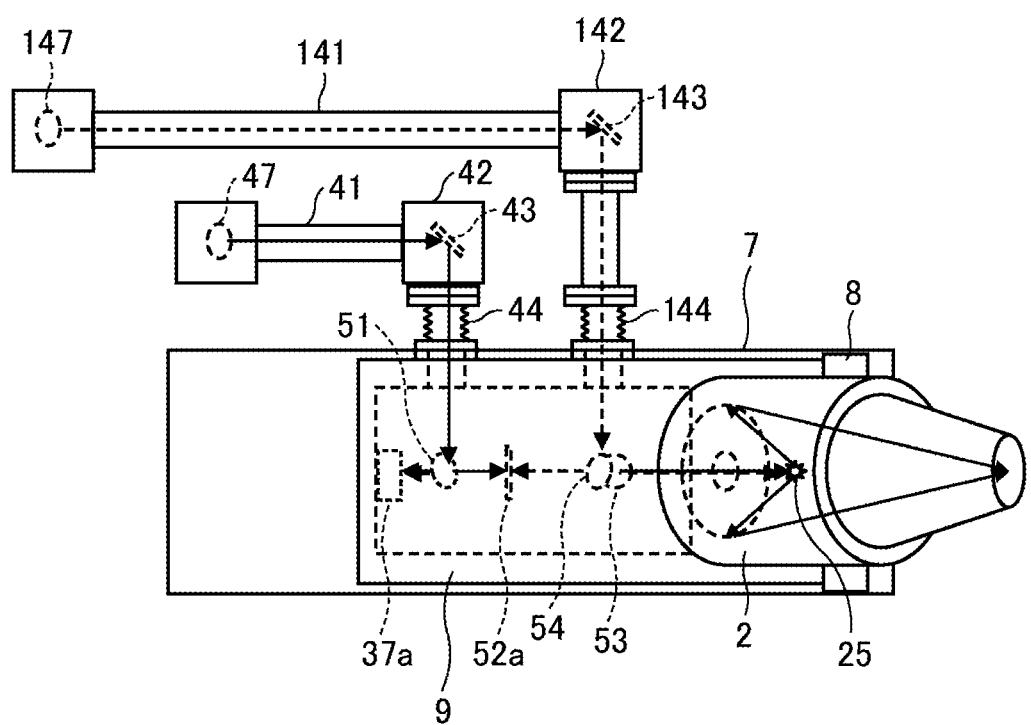
FIG. 7A is a plan view illustrating an EUV light generation apparatus according to a sixth embodiment, which includes a laser beam path control unit for introducing a pre-pulse laser beam and a main pulse laser beam into the EUV light generation apparatus.
Figure 7B:
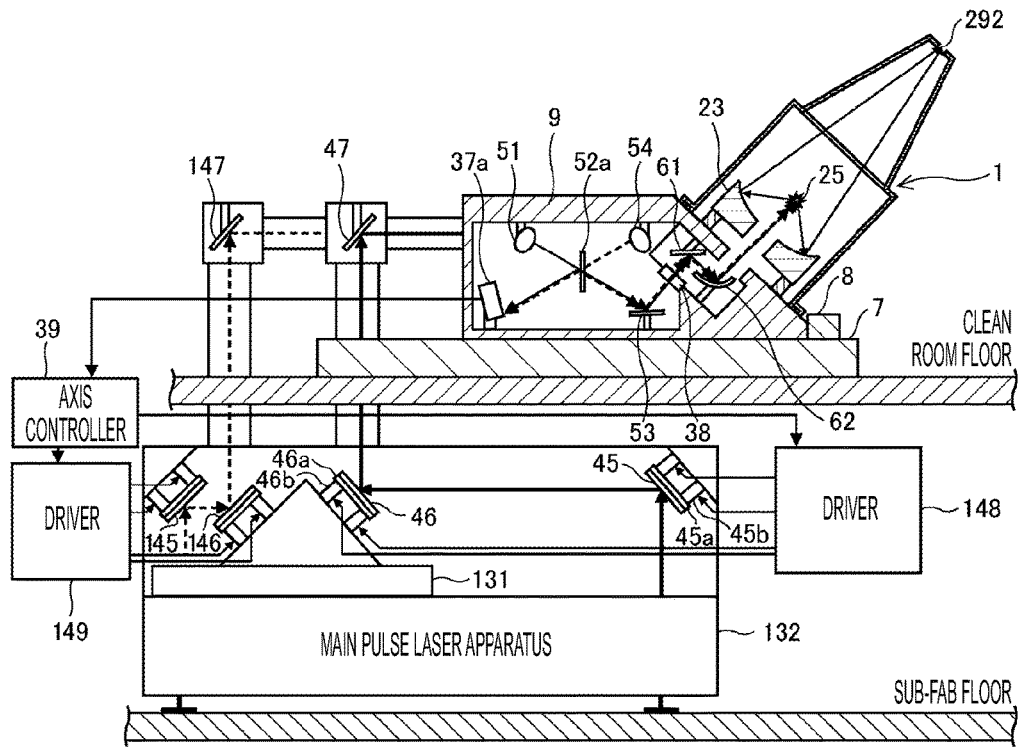
FIG. 7B is a sectional view of the EUV light generation apparatus and the laser beam path control unit shown in FIG. 7A.

8. Laser Beam Path Control Unit for Introducing Two Laser Beams into EUV Light Generation Apparatus: Sixth Embodiment FIG. 7A is a plan view illustrating an EUV light generation apparatus according to a sixth embodiment, which includes a laser beam path control unit for introducing a pre-pulse laser beam and a main pulse laser beam into the EUV light generation apparatus. FIG. 7B is a sectional view of the EUV light generation apparatus and the laser beam path control unit shown in FIG. 7A. In the sixth embodiment, the laser beam path control unit may be used to control the beam path of the pre-pulse laser beam (broken line) from a pre-pulse laser apparatus 131 and the beam path of the main pulse laser beam (solid line) from a main pulse laser apparatus 132 to the EUV light generation apparatus 1. As shown in FIG. 7B, the EUV light generation apparatus 1 may be installed on a clean room floor, and the pre-pulse laser apparatus 131 and the main pulse laser apparatus 132 may be installed on a sub-fab floor.

With reference to FIGS. 7A and 7B, the main pulse laser beam from the main pulse laser apparatus 132 may be reflected sequentially by the high-reflection mirrors, 45, 46, 47, and 43, and enter the reference member 9. The high-reflection mirrors 45 and 46 may be provided with the respective mirror holders 45a and 46a which include the respective actuators 45b and 46b. The high-reflection mirrors 45 and 46, the mirror holders 45a and 46a, and the actuators 45b and 46b may constitute a main pulse laser beam travel direction adjusting mechanism.

A driver (for the main pulse laser beam) 148 may be configured to drive the actuators 45b and 46b, whereby the actuators 45b and 46b may adjust the orientation (posture) of the respective high-reflection mirrors 45 and 46. The laser beam axis controller 39 may be configured to control the driver 148 based on the measurement result of the laser beam measuring device 37a, and the orientation (posture) of the high-reflection mirrors 45 and 46 may be controlled accordingly. With this, the main pulse laser beam may be supplied to a predetermined position inside the reference member 9 at a predetermined angle.

The pre-pulse laser beam from the pre-pulse laser apparatus 131 may be reflected sequentially by high-reflection mirrors, 145, 146, 147, and 143, and enter the reference member 9. The high-reflection mirrors 145 and 146 may be provided with respective mirror holders which include respective actuators, as in the high-reflection mirrors 45 and 46. The high-reflection mirrors 145 and 146, the mirror holders, and the actuators may constitute a pre-pulse laser beam travel direction adjusting mechanism.

A driver (for the pre-pulse laser beam) 149 may be configured to drive the actuators for the high-reflection mirrors 145 and 146, whereby the actuators may adjust the orientation (posture) of the respective high-reflection mirrors 145 and 146. The laser beam axis controller 39 may be configured to control the driver 149 based on the measurement result of the laser beam measuring device 37a, and the orientation (posture) of the high-reflection mirrors 145 and 146 may be controlled accordingly. With this, the pre-pulse laser beam may be supplied to a predetermined position inside the reference member 9 at a predetermined angle. Here, the laser beam measuring device 37a, the laser beam axis controller 39, the drivers 148 and 149, the main pulse laser beam travel direction adjusting mechanism, and the pre-pulse laser beam travel direction adjusting mechanism may constitute the laser beam path control unit.

The optical systems in the EUV light generation apparatus 1 for guiding the pre-pulse laser beam and the main pulse laser beam to the plasma generation region 25 may be similar to those described in the fifth embodiment.

As shown in FIG. 7A, an optical unit 142 may be connected to the reference member 9 through a flexible pipe 144 to introduce the pre-pulse laser beam into the reference member 9. A beam-path tube 141 may be connected to the optical unit 142, and at least one high-reflection mirror 143 may be provided in the optical unit 142. With this configuration, the pre-pulse laser beam from the pre-pulse laser apparatus 131 (see FIG. 7B) may travel through the beam-path tube 141 toward the optical unit 142. In the optical unit 142, the pre-pulse laser beam may be reflected by the high-reflection mirror 143 toward the high-reflection mirror 54 provided inside the reference member 9. With this, the pre-pulse laser beam may enter the laser beam introduction optical system.

The optical unit 42 may be connected to the reference member 9 through the flexible pipe 44 to introduce the main pulse laser beam into the reference member 9. The beam-path tube 41 may be connected to the optical unit 42, and at least one high-reflection mirror 43 may be provided in the optical unit 42. The main pulse laser beam from the main pulse laser apparatus 132 may travel through the beam-path tube 41 toward the optical unit 42. In the optical unit 42, the main pulse laser beam may be reflected by the high-reflection mirror 43 toward the high-reflection mirror 51 provided inside the reference member 9. With this, the main pulse laser beam may enter the laser beam introduction optical system.

Figure 8A:
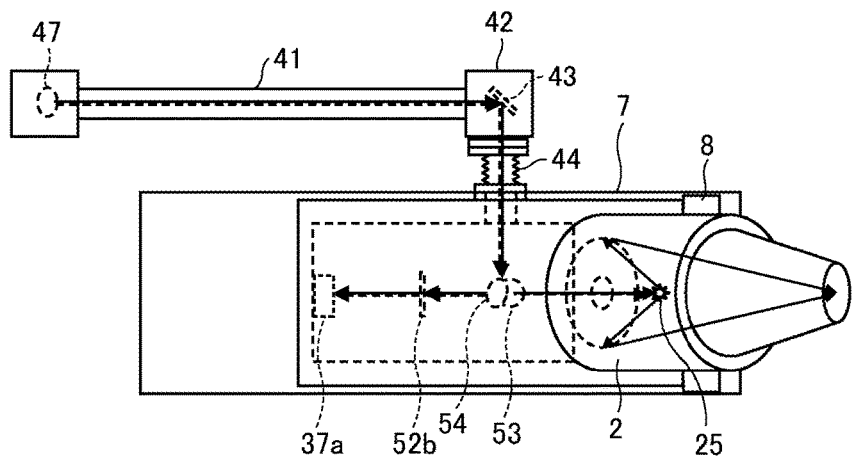
FIG. 8A is a plan view illustrating an EUV light generation apparatus according to a seventh embodiment, which includes a laser beam path control unit for introducing a pre-pulse laser beam and a main pulse laser beam into the EUV light generation apparatus.
Figure 8B:
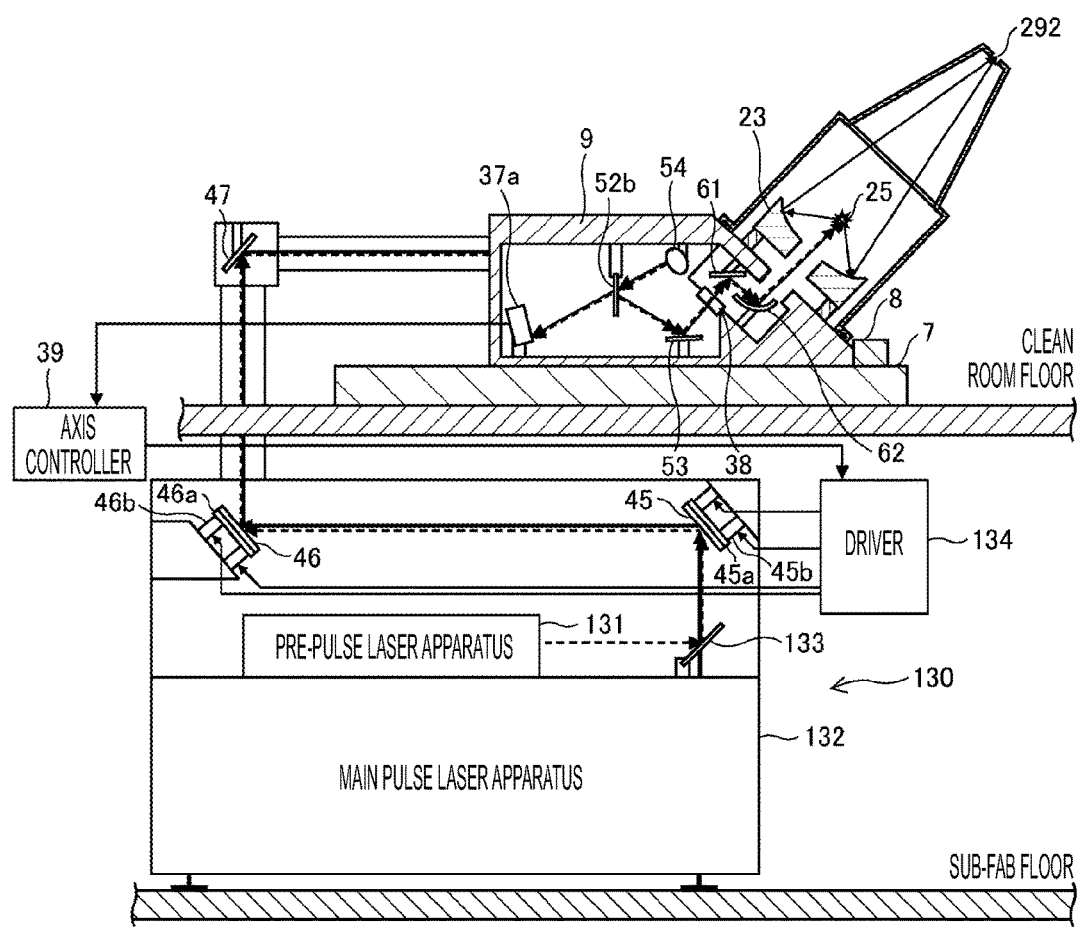
FIG. 8B is a sectional view of the EUV light generation apparatus and the laser beam path control unit shown in FIG. 8A.

9. Laser Beam Path Control Unit for Introducing Two Laser Beams into EUV Light Generation Apparatus: Seventh Embodiment FIG. 8A is a plan view illustrating an EUV light generation apparatus according to a seventh embodiment, which includes a laser beam path control unit for introducing a pre-pulse laser beam and a main pulse laser beam into the EUV light generation apparatus. FIG. 8B is a sectional view of the EUV light generation apparatus and the laser beam path control unit shown in FIG. 8A.

In the seventh embodiment, a beam path adjusting mirror 133 may be positioned to make the beam path of the pre-pulse laser beam from the pre-pulse laser apparatus 131 and the beam path of the main pulse laser beam from the main pulse laser apparatus 132 coincide with each other inside a laser unit 130 that includes the pre-pulse laser apparatus 131 and the main pulse laser apparatus 132. Further, the laser beam path control unit may be used to control the beam path of the pre-pulse laser beam from the pre-pulse laser apparatus 131 and the beam path of the main pulse laser beam from the main pulse laser apparatus to the EUV light generation apparatus 1. As shown in FIG. 8B, the EUV light generation apparatus 1 may be installed on a clean room floor, and the laser unit 130 may be installed on a sub-fab floor.

The beam path adjusting mirror 133 may be positioned to reflect the pre-pulse laser beam from the pre-pulse laser apparatus 131 toward the high-reflection mirror 45 with high reflectance and to transmit the main pulse laser beam from the main pulse laser apparatus 132 toward the high-reflection mirror 45 with high transmittance. With this, the beam path of the pre-pulse laser beam and the beam path of the main pulse laser beam may be adjusted to coincide with each other. Here, the beam path adjusting mirror 133 may be similar in configuration to the beam splitter 52a shown in FIG. 6.

The pre-pulse laser beam and the main pulse laser beam may then be reflected sequentially by the high-reflection mirrors, 45, 46, 47, and 43, and enter the reference member 9. The high-reflection mirrors 45 and 46 may be provided with the respective mirror holders 45a and 46a which include the respective actuators 45b and 46b. The high-reflection mirrors 45 and 46, the mirror holders 45a and 46a, and the actuators 45b and 46b may constitute a laser beam travel direction adjusting mechanism.

A driver 134 may be configured to drive the actuators 45b and 46b, whereby the actuators 45b and 46b may adjust the orientation (posture) of the respective high-reflection mirrors 45 and 46. The laser beam axis controller 39 may be configured to control the driver 134 based on the measurement result of the laser beam measuring device 37a, and the orientation (posture) of the high-reflection mirrors 45 and 46 may be controlled accordingly. With this, the pre-pulse laser beam and the main pulse laser beam may be supplied to a predetermined position inside the reference member 9 at a predetermined angle. Here, the laser beam measuring device 37a, the laser beam axis controller 39, the driver 134, and the laser beam travel direction adjusting mechanism may constitute the laser beam path control unit.

The laser beam introduction optical system may include the high-reflection mirror 54, a beam path adjusting mirror (beam splitter) 52b, the high-reflection mirror 53, and the laser beam measuring device 37a.

The high-reflection mirror 54 may be configured to reflect the pre-pulse laser beam and the main pulse laser beam with high reflectance. The pre-pulse laser beam and the main pulse laser beam reflected by the high-reflection mirror 54 may be incident on the beam path adjusting mirror 52b. The beam path adjusting mirror 52b may be configured to reflect the pre-pulse laser beam and the main pulse laser beam incident thereon toward the high-reflection mirror 53 with high reflectance and to transmit a part of the pre-pulse laser beam and a part of the main pulse laser beam toward the laser beam measuring device 37a.

The pre-pulse laser beam and the main pulse laser beam reflected by the beam path adjusting mirror 52b may be reflected by the high-reflection mirror 53 toward the laser beam focusing optical system with high reflectance. The configuration and the operation past the laser beam focusing optical system may be similar to the configuration and the operation in the fifth embodiment.

The pre-pulse laser beam and the main pulse laser beam transmitted through the beam path adjusting mirror 52b may enter the laser beam measuring device 37a. The laser beam measuring device 37a may be configured to measure the cross-sectional beam intensity profile, the pointing, and the divergence of the pre-pulse laser beam and the main pulse laser beam that have entered the laser beam measuring device 37a.

According to the seventh embodiment, the beam path of the pre-pulse laser beam and the beam path of the main pulse laser beam may be adjusted to coincide with each other inside the laser unit 130. Accordingly, compared to the sixth embodiment, the configuration of the beam delivery path between the laser unit 130 and the reference member 9 and the configuration of the laser beam introduction optical system may be simplified.

10. Supplementary Descriptions 10.1 Laser Beam Measuring Device

Figure 9:
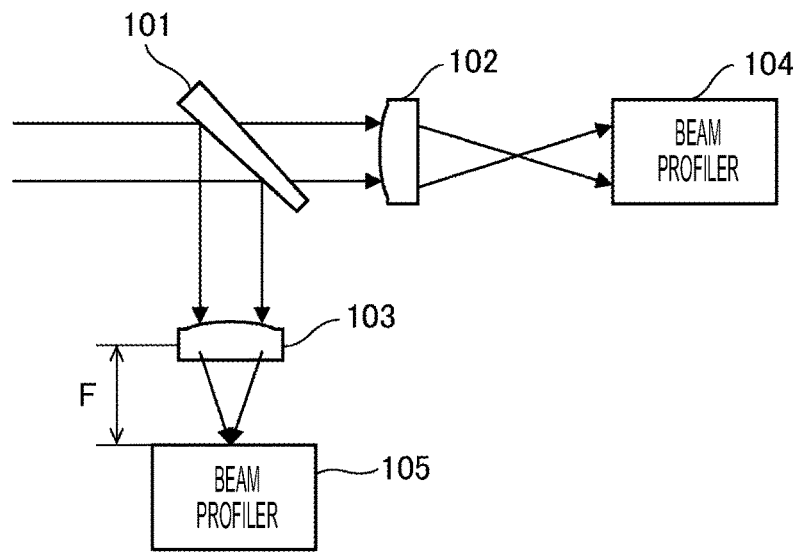
FIG. 9 is a diagram showing a configuration example of a laser beam measuring device.

FIG. 9 is a diagram showing an example of a configuration of a laser beam measuring device. As shown in FIG. 9, the laser beam measuring device 37 may include a beam splitter 101, lenses 102 and 103, and beam profilers 104 and 105. The beam splitter 101 may be wedge-shaped.

A part of a laser beam transmitted through the beam splitter 101 may be incident on the beam profiler 104 via the lens 102. Another part of the laser beam reflected by the beam splitter 101 may be incident on the beam profiler 105 via the lens 103. As shown in FIG. 9, the beam profiler 104 may be provided at a position displaced from the focus of the lens 102 and configured to measure the cross-sectional beam intensity profile of the laser beam incident thereon. The beam profiler 105 may provided at the focus of the lens 103 having a focal distance F and configured to measure the beam profile (pointing and divergence) of the laser beam at its focus.

The center in the cross-section of the laser beam and the size of the cross-section of the laser beam may be calculated from the measurement result of the cross-sectional beam intensity profile of the laser beam. Further, the divergence (wavefront curvature) and the travel direction of the laser beam may be obtained from the measurement result of the beam profile of the laser beam at its focus.

10.2 Laser Beam Travel Direction Adjusting Mechanism

Figure 10:
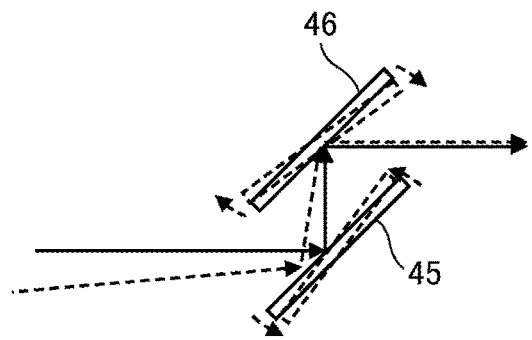
FIG. 10 is a diagram for discussing one example of the operation of a laser beam travel direction adjusting mechanism.
Figure 11:
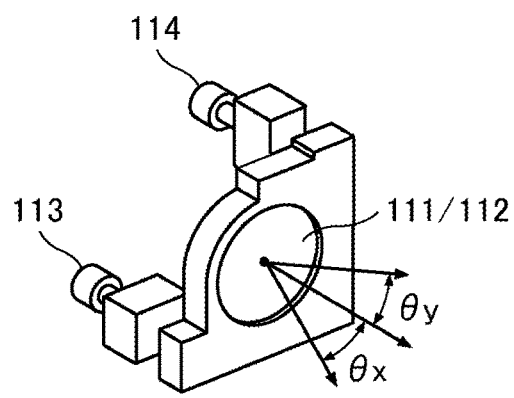
FIG. 11 is a diagram for discussing another example of the operation of a laser beam travel direction adjusting mechanism.

FIG. 10 is a diagram for discussing one example of the operation of a laser beam travel direction adjusting mechanism. The beam path of a laser beam may be adjusted to a desired beam path by controlling tilt angles ($8x$, $8y$), such as shown in FIG. 11, of each of the high-reflection mirrors 45 and 46. Here, the direction of the angle $8x$ may be perpendicular to the direction of the angle $8y$. For example, each of the mirror holders 45a and 46a (as shown, for example, in FIG. 7B), to which the respective mirrors 45 and 46 are mounted, may have a gimbal mechanism, which is a type of swivel with which an object can be rotated about two axes that are orthogonal to each other.

FIG. 11 is a diagram for discussing another example of the operation of a laser beam travel direction adjusting mechanism. In place of the high-reflection mirrors 45 and 46 shown in FIG. 10, two wedge-shaped substrates 111 and 112, through which a laser beam may be transmitted, may be used. The substrates 111 and 112 may be provided in a beam path of a laser beam, and the substrates 111 and 112 may be rotated about the center of the beam path, whereby the beam path may be adjusted to a desired beam path. Even in that case, actuators 113 and 114, which may be driven by a driver, may be provided to control the tilt angles ($8x$, $8y$) of the substrates 111 and 112. Alternatively, the high-reflection mirrors 45 and 46 shown in FIG. 10 may be provided with the actuators 113 and 114, and the tilt angles of the high-reflection mirrors 45 and 46 may be controlled by driving the actuators 113 and 114.

The above-described embodiments and the modifications thereof are merely examples for implementing this disclosure, and this disclosure is not limited thereto. Making various modifications according to the specifications or the like is within the scope of this disclosure, and other various embodiments are possible within the scope of this disclosure. For example, the modifications illustrated for particular ones of the embodiments can be applied to other embodiments as well (including the other embodiments described herein).

The terms used in this specification and the appended claims should be interpreted as "non-limiting." For example, the terms "include" and "be included" should be interpreted as "including the stated elements but not limited to the stated elements." The term "have" should be interpreted as "having the stated elements but not limited to the stated elements." Further, the modifier "one (a/an)" should be interpreted as "at least one" or "one or more."

What is claimed is:

1. An apparatus for generating extreme ultraviolet light by irradiating a target material with a laser beam to turn the target material into a plasma, the apparatus comprising:
   a reference member;
   a chamber mounted on the reference member;
   a target supply unit mounted on the chamber and configured to supply the target material into the chamber;
   a laser beam introduction optical system mounted on the reference member and configured to introduce the laser beam into the chamber;
   a laser beam focusing optical system mounted on a first holder and configured to focus the laser beam onto the target material, the first holder being mounted on the reference member; and
   a collector mirror mounted on a second holder and configured to collect the extreme ultraviolet light emitted from the target material, the second holder being mounted on the reference member, wherein
   the chamber has a first opening, the chamber is mounted on an upper surface of the reference member, a seal is provided between a periphery of the first opening of the chamber and the upper surface of the reference member, and
   the second holder is mounted on the upper surface of the reference member, thereby connecting the collector mirror and the reference member through the first opening.

2. The apparatus according to claim 1, wherein the laser beam focusing optical system is mounted on a downstream side of the laser beam introduction optical system on a beam path of the laser beam.

3. The apparatus according to claim 2, wherein the laser beam focusing optical system is mounted on the beam path between the laser beam introduction optical system and the collector mirror.

4. The apparatus according to claim 3, wherein the collector mirror has a through-hole at a center of the collector mirror, through which the laser beam travels.

5. The apparatus according to claim 4, wherein the reference member has a housing shape.

6. The apparatus according to claim 5, wherein reference member including:
   a second opening configured to introduce the laser beam; and
   a third opening configured to introduce the laser beam to the chamber.

7. The apparatus according to claim 1, wherein the laser beam focusing optical system is mounted on a beam path of the laser beam between the laser beam introduction optical system and the collector mirror.

8. The apparatus according to claim 1, wherein the collector mirror has a through-hole at a center of the collector mirror, through which the laser beam travels.

9. The apparatus according to claim 1, wherein the reference member has a housing shape.

10. The apparatus according to claim 1, wherein the reference member including:
    a second opening configured to introduce the laser beam, and
    a third opening configured to introduce the laser beam to the chamber.

11. The apparatus according to claim 2, further comprising a window mounted on the reference member and configured to keep the pressure inside the chamber.

12. The apparatus according to claim 11, wherein the window is disposed on a beam path of the laser beam between the laser beam introduction optical system and the laser beam focusing optical system.

13. The apparatus according to claim 12, further comprising a measuring device mounted on the reference member, on a beam path of the laser beam between the window and the laser beam introduction optical system.

14. The apparatus according to claim 1, further comprising a measuring device mounted on the reference member and configured to measure the laser beam.

15. The apparatus according to claim 14, wherein the measuring device has at least one beam profiler.

16. The apparatus according to claim 15, wherein the measuring device has a plurality of beam profilers.

17. The apparatus according to claim 1, further comprising a moving mechanism configured to move the reference member.

18. The apparatus according to claim 17, wherein the moving mechanism has a plurality of rails.

19. The apparatus according to claim 17, further comprising a positioning device configured to prevent the reference member from moving.

20. The apparatus according to claim 1, further comprising a positioning device configured to prevent the reference member from moving.

21. The apparatus according to claim 20, wherein the positioning device positions the reference member at least three points.

22. The apparatus according to claim 1, wherein the collector mirror is mounted on the second holder at a back surface of the collector mirror, the back surface being substantially perpendicular to a travel direction of the laser beam.

* * * * *